United States Patent [19]

Kil Sub

[11] Patent Number: 5,093,709
[45] Date of Patent: Mar. 3, 1992

[54] LEAD FRAME HAVING A DIAGONALLY TERMINATING SIDE RAIL END

[75] Inventor: Ro Kil Sub, Seoul, Rep. of Korea

[73] Assignee: Hyundai Electronics Industries Co., Ltd., Rep. of Korea

[21] Appl. No.: 618,163

[22] Filed: Nov. 26, 1990

[30] Foreign Application Priority Data

Nov. 28, 1989 [KR] Rep. of Korea ............ 89-17653

[51] Int. Cl.$^5$ .................. H01L 23/12; H01L 21/68
[52] U.S. Cl. ............................................. 357/70; 357/68
[58] Field of Search .............................. 357/70, 68, 72

[56] References Cited

FOREIGN PATENT DOCUMENTS

| | | | |
|---|---|---|---|
| 59-150458 | 8/1984 | Japan | 357/70 |
| 61-104650 | 5/1986 | Japan | 357/70 |
| 61-135146 | 6/1986 | Japan | 357/70 |

Primary Examiner—Rolf Hille
Assistant Examiner—S. V. Clark
Attorney, Agent, or Firm—Ladas & Parry

[57] ABSTRACT

A lead frame for use in a molding process of supplying an epoxy resin through a runner and a gate into a cavity formed in the lead frame, is disclosed. The lead frame comprises a first and a second side rail and a plurality of leads extending therefrom formed between the first and the second side rails. The first and the second side rails further include an end diagonally terminating at a point which is distally positioned relative to said cavity such that in use said diagonally terminating ends prevents the formation of an epoxy resin flash coating on a lead surface 7 existing between said runner 5Y and each lead 8 of said plurality of leads 8N during the molding process.

1 Claim, 2 Drawing Sheets

LEAD FRAME HAVING A DIAGONALLY TERMINATING SIDE RAIL END

BACKGROUND OF INVENTION

1. Field of the Invention

The invention relates to a lead frame for an integrated semiconductor device, and more particularly, to a lead frame in which the occurrence of an undesirable flash coating during the molding process step in the manufacturing process is prevented by modifying the shape of the side rail of the lead frame.

2. Information Disclosure Statement

The lead frame of the prior art is, as shown in FIG. 1, formed into a structure in which each end (U, Z) of side rails 2H, 2Y, respectively, on both sides of a lead frame 1 extends beyond the cavity whereas the remaining ends X, Y of side rails, 2H, 2Y, respectively, terminate proximate the cavity with a cut which is perpendicular to the direction of the side rail.

Therefore, there is a problem in that during the molding process of the lead frame 1 for encapsulating a chip portion IA mounted at a cavity 3 of the lead frame 1, the epoxy resin mis-flows in the direction of an arrow "K" as shown in FIG. 3 through ends X,Y of the side rails 2H, 2Y of the lead frame which terminate proximate the cavity, producing a flash coating 9 in the lead surface 7 which is the surface which exists between a runner 5Y and each lead 8 of a plurality of leads 8N.

Therefore, it is an object of the present invention to provide a lead frame in which the occurrence of an undesirable flash coating during the molding process is prevented by forming side rails having an end which diagonally terminates in a point which is distally positioned relative to the cavity.

It is a further object of the present invention to provide a lead frame which is economical to produce.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

A lead frame of the present invention is defined by the claims with a specific embodiment shown in the attached drawings. For the purpose of summarizing the invention, the invention relates to a lead frame for use in a molding process of supplying an epoxy resin through a runner and a gate into a cavity formed in the lead frame. The lead frame comprises a first and a second side rail with cavity having a plurality of leads extending therefrom formed between the first and the second side rails. The first and the second side rails further include an end diagonally terminating at a point which is distally positioned relative to the cavity such that in use the diagonally terminating ends prevents the formation of an epoxy resin flash coating on a lead surface 7 existing between the runner 5Y and each lead 8 of the plurality of leads 8N during the molding process.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

Figure 1:
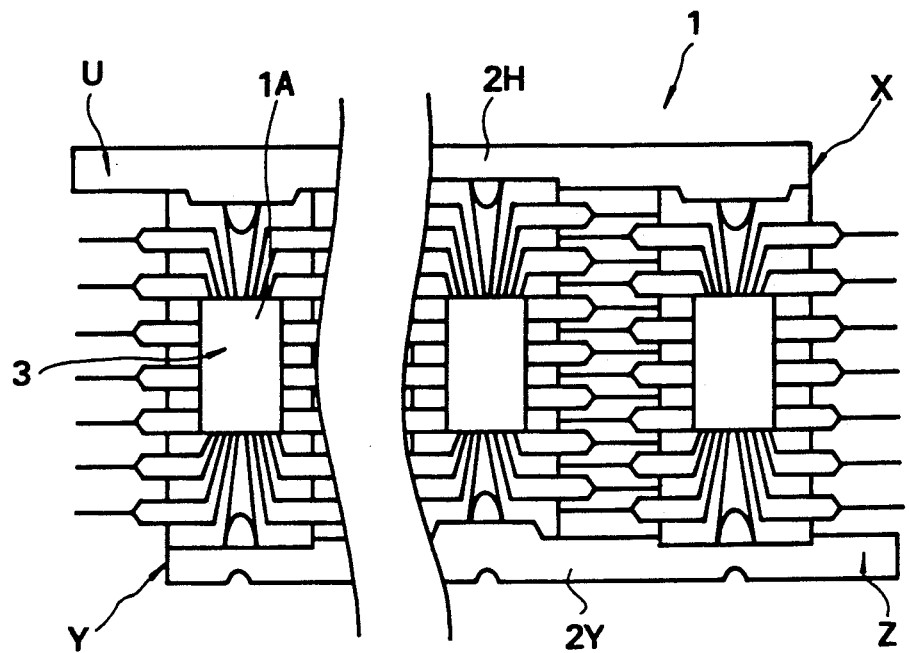
FIG. 1 is a top view of a conventional lead frame.

FIG. 1 is a top view showing side rails 2H, 2Y of the lead frame 1 of the prior art. Each end U, Z of each of the side rails 2H, 2Y, respectively, extends distally beyond the cavity 3 of the lead frame 1 whereas each respective opposing end X, Y of side rails 2H, 2Y is cut proximate the cavity. This conventional structure results in the flash coating problem as discussed above.

Figure 2:
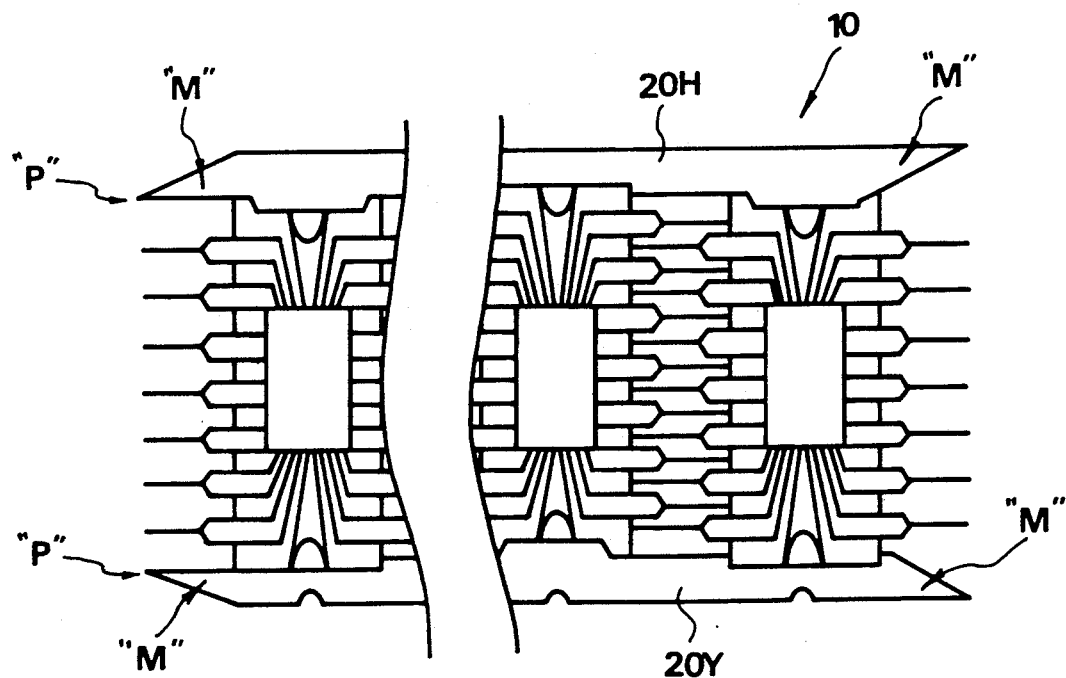
FIG. 2 is a top view of a lead frame of the present invention.

FIG. 2 illustrates each end M of each of the side rails 20H, 20Y of a lead frame 10 of the present invention being cut diagonally. As illustrated, the cut begins distal to the cavity and ends proximate to the cavity in a diagonal manner to thereby form at each end of each of the side rails 20H, 20Y a diagonal cut. The detailed description of the structural characteristics of the present invention will be given in more detail with reference to the prior art (FIG. 3) and the present invention (FIG. 4).

Figure 3:
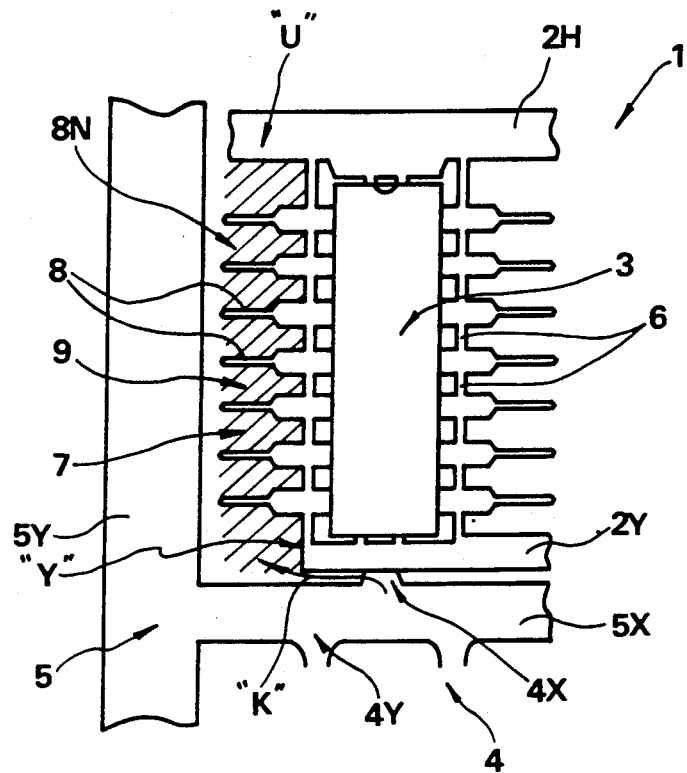
FIG. 3 shows the formation of the flash coating when the molding process is carried out utilizing a conventional lead frame.

Referring to FIG. 3, when the molding process is carried out by utilizing the lead frame having the conventional structure as shown in FIG. 1, epoxy resin is poured into the cavity 3 through a runner 5 and a gate 4. However, if the upper portion 4X and the lower portion 4Y of the gate 4 of mold are not aligned exactly with the side rails 2H, 2Y of the lead frame 1 or are fit loosely against the side rails, a portion of epoxy resin flows in the direction of the arrow "K" during the molding process resulting in an undesirable flash coating 9 on the lead surface 7 existing between a runner 5Y and each lead 8 of a plurality of leads 8N.

The reason why the flash coating occurs is partly due to the fact that the gate 4 formed in the runner 5 is not exactly positioned or is loose as mentioned above. Also, and most importantly, because the portion Y of the side rail 2Y of the lead frame 1 terminates proximate the cavity so that epoxy resin mis-flows in the direction of the arrow "K" and into the lead surface 7. This undesirable flash coating must then be removed during a dam bar 6 removing process after the molding process or during the forming process in which the plurality of leads 8N are formed, which is of great inconvenience.

Figure 4:
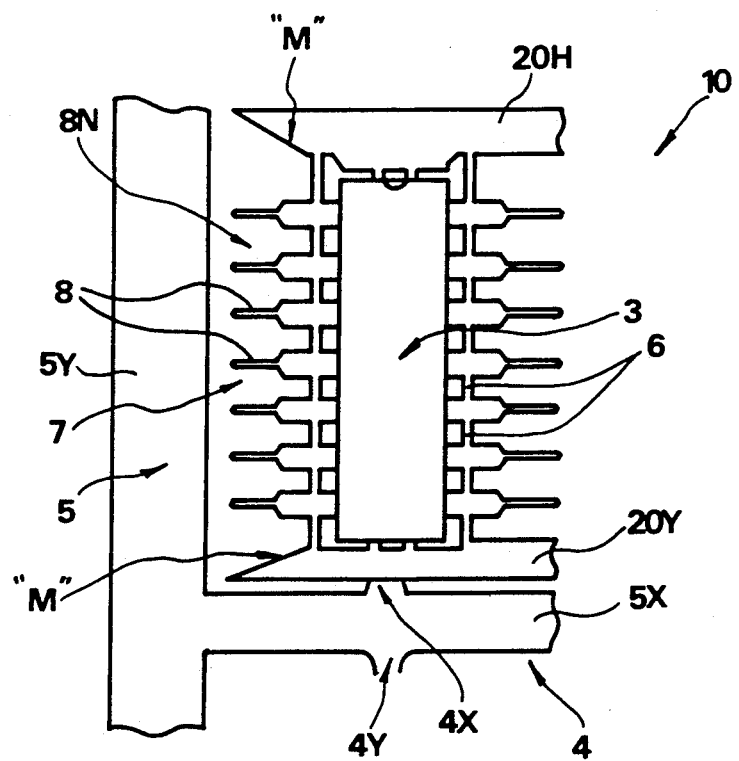
FIG. 4 shows the absence of the flash coating when the molding process is carried out utilizing the lead frame of the present invention.

FIG. 4 shows the result where the molding process is carried out utilizing the lead frame 10 of the present invention as shown in FIG. 2. In the lead frame 10 of the present invention, even when the mold adjacent the gate is not exactly positioned, the epoxy resin cannot invade during the molding process because the ends M of side rails 20H, 20Y have a diagonal shape, preventing the formation of the flash coating at lead surface 7 between the respective leads 8 of the plurality of leads 8N positioned between the side of the cavity 3 and the runner 5Y. Other structures are not described herein they are same as FIG. 3.

In the present invention as described above, the prior art process can be improved because the formation of the flash coating during the molding process can be prevented by using a lead frame having side rails ends which diagonally terminate distal to the cavity.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A lead frame for use in a molding process for encapsulating a chip in an epoxy resin by supplying the epoxy resin through a runner and a gate to said lead frame, said lead frame comprising:

a first side rail and a second side rail being spaced apart from each other;

a cavity for mounting the chip and for receiving the epoxy resin for encapsulating the chip, with said cavity having a plurality of leads extending therefrom and being formed between said first and said second side rails; and each of said first and said second side rail including an end diagonally terminating at a point which is distally positioned relative to said cavity and which, in use is also proximately positioned relative to said runner such that said end prevents the formation of an epoxy resin flash coating on a lead surface existing between said runner and each lead of said plurality of leads of said cavity during the molding process.

* * * * *